United States Patent [19]
Hagiwara

[11] Patent Number: 5,847,427
[45] Date of Patent: Dec. 8, 1998

[54] NON-VOLATILE SEMICONDUCTOR MEMORY DEVICE UTILIZING AN OXIDATION SUPPRESSING SUBSTANCE TO PREVENT THE FORMATION OF BIRD'S BREAKS

[75] Inventor: Hiroyuki Hagiwara, Ichikawa, Japan

[73] Assignee: Kabushiki Kaisha Toshiba, Tokyo, Japan

[21] Appl. No.: 767,084

[22] Filed: Dec. 16, 1996

[30] Foreign Application Priority Data

Dec. 21, 1995 [JP] Japan ................................ 7-332874

[51] Int. Cl.[6] ................................................ H01L 29/792
[52] U.S. Cl. .......................... 257/324; 257/316; 257/411; 438/591; 438/257; 438/287
[58] Field of Search ...................... 257/315, 316, 257/324, 325, 649, 411, 410; 437/42, 43; 438/257, 287, 591

[56] References Cited

U.S. PATENT DOCUMENTS

| | | | |
|---|---|---|---|
| 5,304,829 | 4/1994 | Mori et al. | 257/324 |
| 5,422,291 | 6/1995 | Clement et al. | 437/43 |
| 5,567,638 | 10/1996 | Lin et al. | 438/261 |
| 5,661,056 | 8/1997 | Takeuchi | 438/261 |

*Primary Examiner*—David B. Hardy
*Attorney, Agent, or Firm*—Loeb & Loeb LLP

[57] ABSTRACT

A non-volatile semiconductor memory device is provided that includes a semiconductor substrate having a first conductivity type, and diffusion regions having a second conductivity type formed in the surface of the semiconductor substrate at predetermined locations. A gate insulation film is formed on the semiconductor substrate, and a conductive floating gate is formed over the gate insulation film. Additionally, an interpoly insulation film is formed on the upper surface of the floating gate, and a conductive control gate is formed over the interpoly insulation film. Further, the upper surface of the floating gate and/or the upper surface of the interpoly insulation film contain an oxidization suppressing substance. The oxidization suppressing substance suppresses the reaction with the oxidizer during post oxidization, and thus prevents the formation of bird's beaks in the upper and/or lower portions of the interpoly insulation film. Thus, the deteriration of the write/erase characteristics of the memory cells is reduced, and variations in the write/erase characteristics of the memory cells are lessened. The present invention also provides a method of manufacturing such a non-volatile semiconductor memory device.

22 Claims, 6 Drawing Sheets

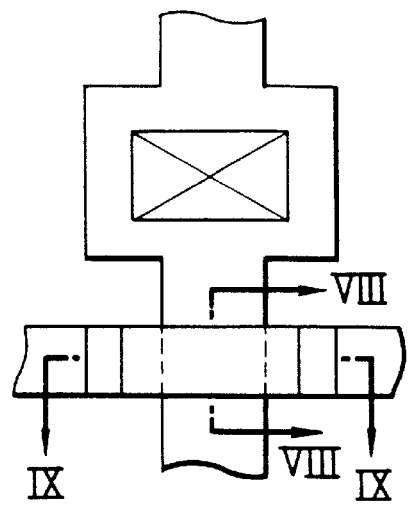
F I G. 7
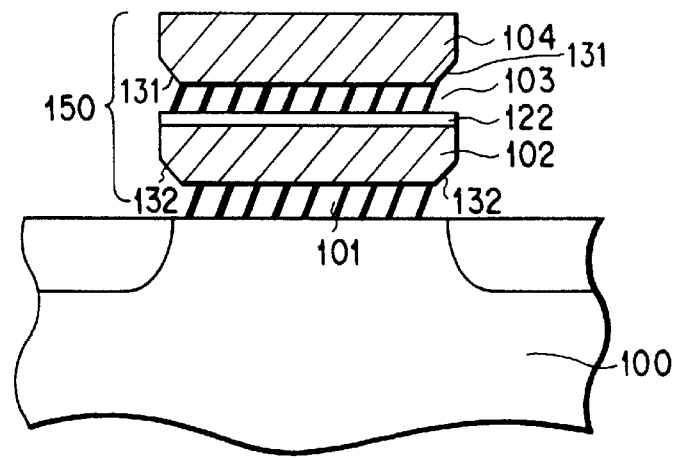
F I G. 8
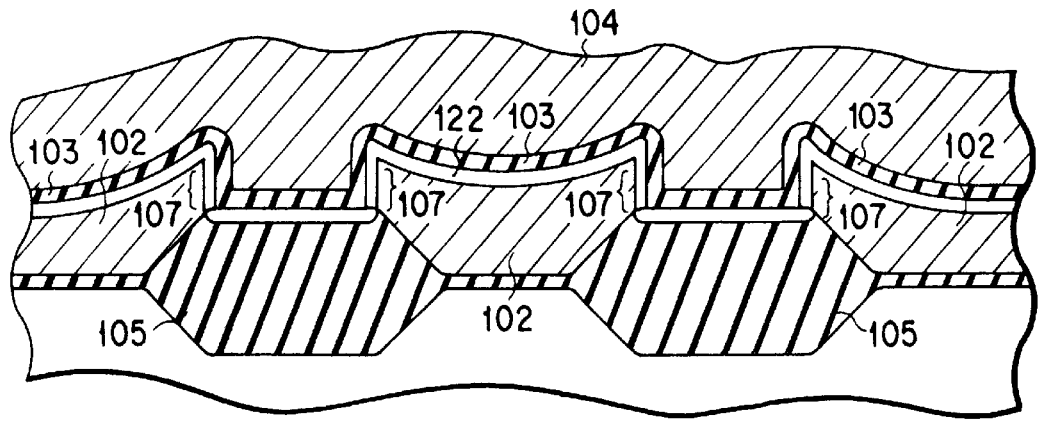
F I G. 9

NON-VOLATILE SEMICONDUCTOR MEMORY DEVICE UTILIZING AN OXIDATION SUPPRESSING SUBSTANCE TO PREVENT THE FORMATION OF BIRD'S BEAKS

FIELD OF THE INVENTION

The present invention relates to a non-volatile semiconductor memory device and a method of manufacturing such a device, and more specifically to a non-volatile semiconductor memory device in which an oxidization suppressing substance is provided in an upper portion of a floating gate and/or a lower portion of a control gate to prevent the formation of bird's beaks.

BACKGROUND OF THE INVENTION

An example of a non-volatile semiconductor memory device that can be electrically erased and rewritten is a device having memory cells with a stack-type structure. In such a memory cell, a control gate is stacked above a floating gate. FIG. 1 shows a plan view of a conventional stack-type memory cell A cross sectional view of the conventional memory cell taken along line II—II of FIG. 1 is shown in FIG. 2, and a cross sectional view taken along line III—III of FIG. 1 is shown in FIG. 3.

As shown in FIG. 2, in the stack-type memory cell structure, a first thin insulation film 501 is provided on a semiconductor substrate 500. A floating gate 502 made of conductive polysilicon is laminated on the first insulation film 501. A second thin insulation film 503 is provided on the floating gate 502, and a control gate 504 made of conductive polysilicon is laminated on the second insulation film 503. Thus, the first insulation film layer 501 functions as a first gate insulation film, and the second insulation film layer 503 functions as an interpoly insulation film In the memory cell of FIG. 2, gate bird's beaks 532 are formed in the lower edge of the floating gate 502, and gate bird's beaks 530 are formed in the upper edge of the floating gate. Similarly, gate bird's beaks 531 are formed in the lower edge of the control gate 504. FIG. 3 shows a cross section of the memory cell of FIG. 1.

A typical non-volatile semiconductor memory device includes a core portion that contains the memory cells and a peripheral portion that contains peripheral circuitry used for reading data from and writing data to the memory cells of the core portion. A conventional method of manufacturing a non-volatile semiconductor memory device having memory cells with a stack-type structure will now be explained with reference to FIGS. 4A through 4E. Each of these figures shows a typical memory cell section 650 from the core portion of the device and a typical peripheral transistor section 652 from the circuitry in the peripheral portion. First, as shown in FIG. 4A, a field oxide film 605 is formed on a substrate 600 in both the memory cell section 650 and the peripheral transistor section 652 using a known selective oxidization method. Next, a thin gate insulation film 601 is formed on the surface of the substrate. A floating gate layer 602, which is formed illustratively of polysilicon to which an impurity has been introduced, is subsequently formed in both the memory cell section 650 and the peripheral transistor section 652.

Then, as shown in FIG. 4B, a resist 610 is applied over the floating gate layer 602 in order to form an element separation region (or slit) in the memory cell section 650. The resist 610 is exposed and developed, and then used as a mask to etch the floating gate layer 602 using reactive ion etching ("RIE") or the like. After removing the resist, a thin interpoly insulation film 603 is formed in both the memory cell section 650 and the peripheral transistor section 652 using chemical vapor deposition ("CVD"), as shown in FIG. 4C. Next, a second resist 611 is applied over the entire surface of the core portion, which includes the memory cell section 650 shown in FIG. 4D. Then, the interpoly insulation film 603, the floating gate layer 602, and the gate insulation film 601, are successively removed from the peripheral portion of the device (including the peripheral transistor section 652) using RIE or the like.

As shown in FIG. 4E, after removing the resist 611, a second gate insulation film 609 is formed on the gate insulation film 601 in the peripheral transistor section 652 using a heat oxidizing method. Then, a polysilicon layer 604 to which an impurity has been introduced is formed in both the memory cell section 650 and the peripheral transistor section 652. The polysilicon layer 604 functions as a control gate in the memory cell section 650, and as a gate electrode in the peripheral transistor section 652. Next, a third resist (not shown) is applied over the polysilicon layer 604, and parallel grooves perpendicular to the slit pattern are formed in the resist. Then, using the resist as a mask, the polysilicon layer 604 (i.e., the control gate), the interpoly insulation film 603, and the polysilicon layer 602 (i.e., the floating gate) are successively etched in the memory cell section 650. Additionally, in the peripheral transistor section 652, the polysilicon layer 604 (i.e., the gate electrode) is etched. FIG. 5 shows cross sectional views of the memory cell section 650 (taken along line A'—A' of FIG. 4E) and the peripheral transistor section 652 (taken along line B'—B' of FIG. 4E) after the gates have been etched.

Then, as shown in FIG. 6, the entire surface of the core portion (including the memory cell section 650) and the peripheral portion (including the peripheral transistor section 652) is subjected to a thermal oxidization (Le., "post oxidization") to form an insulation film 680 in both portions. An impurity is then implanted through the insulation film 680 by a known ion implantation method to form diffusion layers 690 and 691 in the memory cell section 650 and the peripheral transistor section 652. In each section, the diffusion layers 690 and 691 function as the source/drain regions of the respective transistors. Finally, although not shown in the figures, an interlayer insulation film and wiring are formed to complete the non-volatile semiconductor memory device.

During the post oxidization procedure described above, the oxide film 680 is formed on both the control gate 604 in the memory cell section 650 and the gate electrode 604 in the peripheral transistor section 652. The combination of the oxide film 680 and the polysilicon layer 604 prevents ion species from breaking through to the interpoly insulation film 603 and the second gate insulation film 609 during the ion implantation procedure that forms the source/drain regions of the respective transistors. Therefore, the ion implantation procedure does not lower the threshold voltage of the transistor. Further, the combination of the oxide film 680 and the polysilicon layer 604 prevent uneven ion implantation into the insulation films, so a threshold voltage variance between memory cell transistors does not arise. Thus, the implantation procedure does not cause the quality of the memory device to deteriorate.

Additionally, the post oxidization procedure causes bird's beaks 632 and 635 to be formed in the lower edges of the floating gate 602 in the memory cell section 650 and the gate electrode 604 in the peripheral transistor section 652. The bird's beaks 632 and 635, which are rounded edges on the lower portions of the respective gates, suppress the concentration of an electrical field to effectively protect the gate oxide films 601 and 609 in both the memory cell section 650 and the peripheral transistor section 652. More specifically, in non-volatile memory devices, a high voltage is applied to the peripheral circuitry to write or erase data. The provision of the bird's beaks in the lower edges of the gate electrode functions to prevent a breakdown of the gate oxide film when such high voltages are applied to the transistor. Therefore, the bird's beaks are very important, and the step of post oxidization cannot be omitted.

However, during the post oxidization procedure, bird's beaks 630 and 631 are also formed in the upper edge of the floating gate 602 and the lower edge of the control gate 604. The bird's beaks 630 and 631 expand the region of the interpoly insulation film 603 such that the thickness at the peripheral portions of the interpoly insulation film 603 is increased. As a result, the capacity of the interpoly insulation film 603 is decreased, and the capacity ratio between the gate insulation film 601 and the interpoly insulation film 603 varies. This variance in the capacity ratio influences the write/erase characteristics of a memory cell.

Further, the thickness of the interpoly insulation film 603 and the thickness of the gate insulation film 601 typically differ. Therefore, the bird's beaks 630 and 631 adjacent to the interpoly insulation film are typically larger than the bird's beaks 632 adjacent to the gate insulation film 601. As the size of the bird's beaks increases, it takes longer to write data to (or erase data from) a memory cell. Thus, the write/erase characteristics of the memory cell deteriorate as the bird's beaks become larger. Additionally, the location of the bird's beaks 630 and 631 differs from one memory cell to another. This leads to a variance in the write/erase characteristics of the memory cells in the device. Therefore, in the conventional non-volatile semiconductor memory device, the bird's beaks adjacent to the interpoly insulation film cause a deterioration in the characteristics of the memory cells.

SUMMARY OF THE INVENTION

In view of these problems, it is an object of the present invention to remove the above-mentioned drawbacks and to provide a non-volatile semiconductor memory device in which the deterioration of the write/erase characteristics of the memory cells is reduced, and variations in the write/erase characteristics of the memory cells are lessened. To achieve this object, an oxidization suppressing substance is provided in an upper portion of the floating gate and/or a lower portion of the control gate. This suppresses the reaction with the oxidizer during the post oxidization procedure, and thus prevents the formation of bird's beaks in the upper and/or lower portions of the interpoly insulation film Thus, the deterioration of the write/erase characteristics of the memory cells is reduced, and variations in the write/erase characteristics of the memory cells are lessened. The present invention also provides a method of manufacturing such a non-volatile semiconductor memory device in a simple manner.

According to a preferred embodiment of the present invention, a non-volatile semiconductor memory device is provided that includes a semiconductor substrate having a first conductivity type, and diffusion layers having a second conductivity type opposite to the first conductivity type. The diffusion layers are formed in the surface of the semiconductor substrate at predetermined positions. A gate insulation film is formed on the semiconductor substrate, and a conductive floating gate is formed on the gate insulation film In this embodiment, the upper surface of the floating gate contains an oxidization suppressing impurity. Additionally, an interpoly insulation film is formed on the upper surface of the floating gate, and a conductive control gate is formed on the interpoly insulation film In another embodiment of the present invention, the upper surface of the interpoly insulation film contains an oxidization suppressing impurity.

According to the present invention, there is also provided a method of manufacturing a non-volatile semiconductor memory device by forming a gate insulation film on a semiconductor substrate, and depositing a conductive polysilicon layer, which is to serve as a floating gate, on the gate insulation film. In one embodiment, an oxidization suppressing substance is introduced to the upper surface of the polysilicon layer. Additionally, an interpoly insulation film is formed on the upper surface of the polysilicon layer, and a conductive control gate is formed on an upper surface of the interpoly insulation film In a further embodiment, an oxidization suppressing substance is introduced to the upper surface of the interpoly insulation film Other objects, features, and advantages of the present invention will become apparent from the following detailed description. It should be understood, however, that the detailed description and specific examples, while indicating preferred embodiments of the invention, are given by way of illustration only and various modifications may naturally be performed without deviating from the scope of the present invention.

BRIEF DESCRIPTION OF THE DRAWINGS

FIG. 7 is a plan view of a non-volatile semiconductor memory device according to a first embodiment of the present invention;

FIG. 8 is a cross sectional view of the device of the first embodiment taken along line VIII—VIII of FIG. 7;

FIG. 9 is a cross sectional view of the device of the first embodiment taken along line IX—IX of FIG. 7;

DETAILED DESCRIPTION OF PREFERRED EMBODIMENTS

Figure 1:
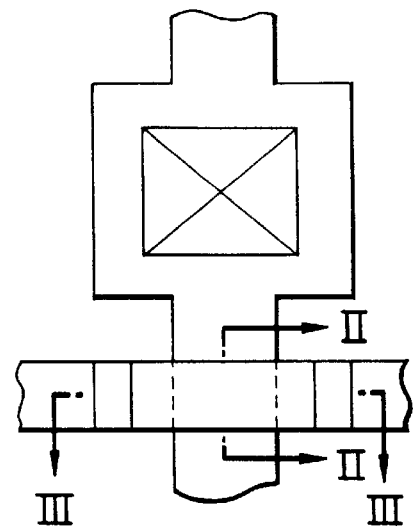
FIG. 1 is a plan view of a conventional stack-type memory cell.
Figure 2:
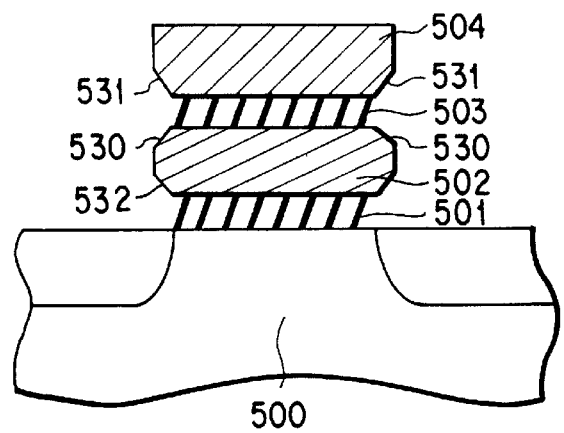
FIG. 2 is a cross sectional view of the conventional memory cell taken along line II—II of FIG. 1.
Figure 3:
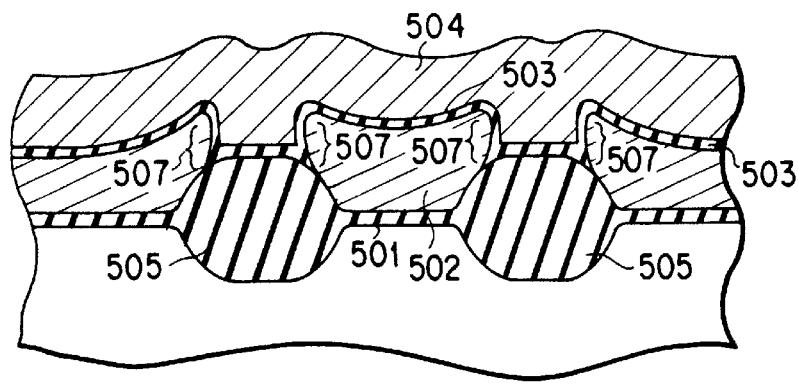
FIG. 3 is a cross sectional view of the conventional memory cell taken along line III—III of FIG. 1.
Figure 4A:
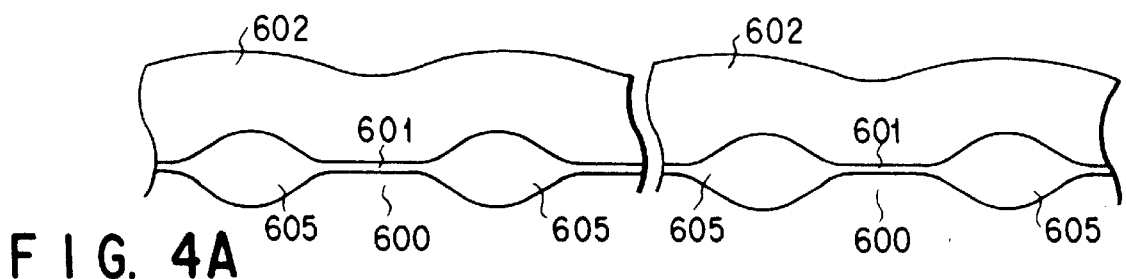
FIGS. 4A through 4E are diagrams illustrating a method of manufacturing a conventional non-volatile semiconductor memory device.
Figure 4B:
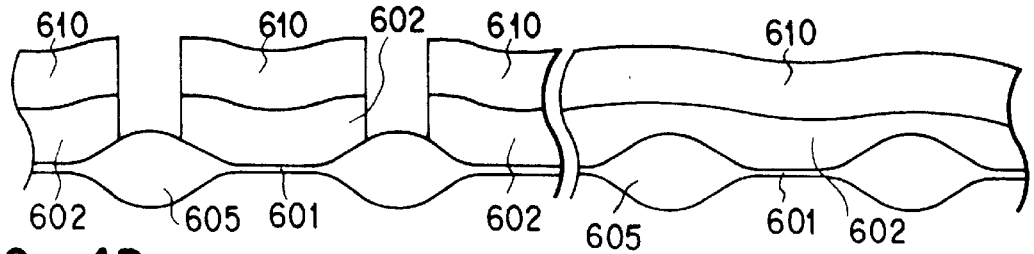
Figure 4C:
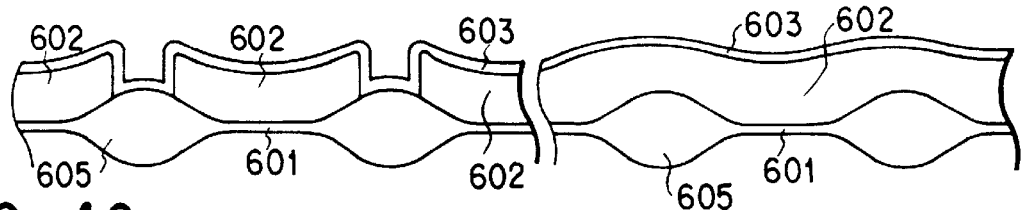
Figure 4D:
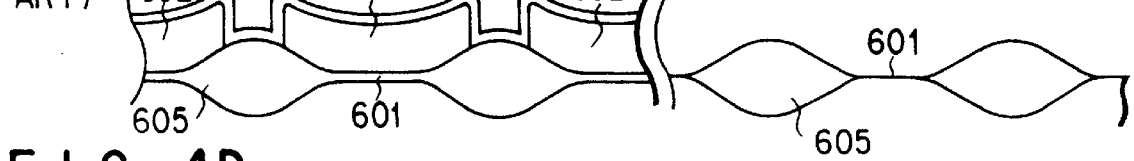
Figure 4E:
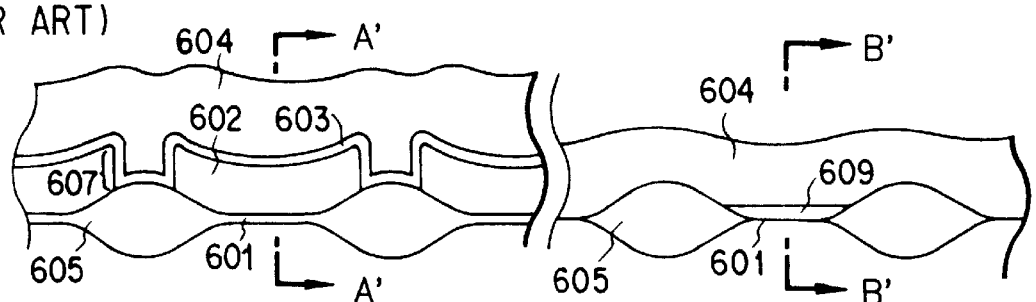
Figure 5:
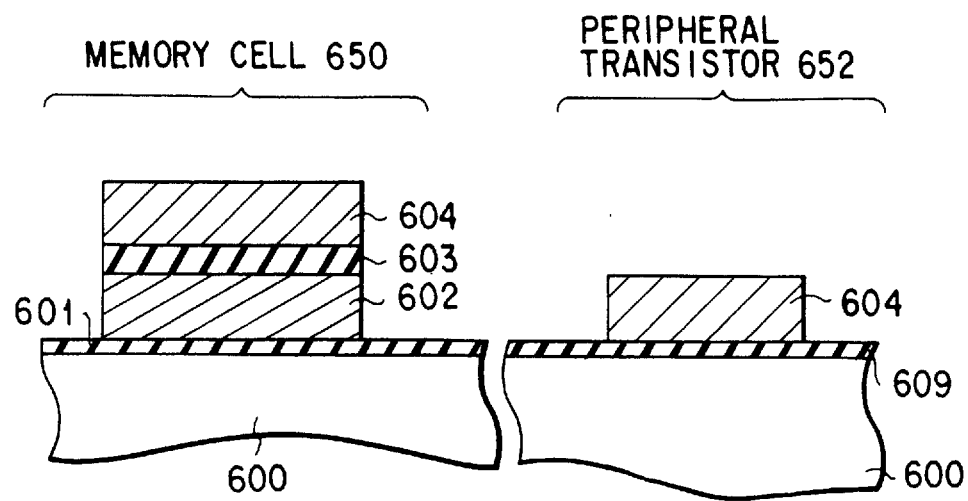
FIG. 5 is a diagram showing a cross sectional view of a conventional memory cell section taken along line A'—A' of FIG. 4E and a cross sectional view of a peripheral transistor section taken along line B'—B' of FIG. 4E.
Figure 6:
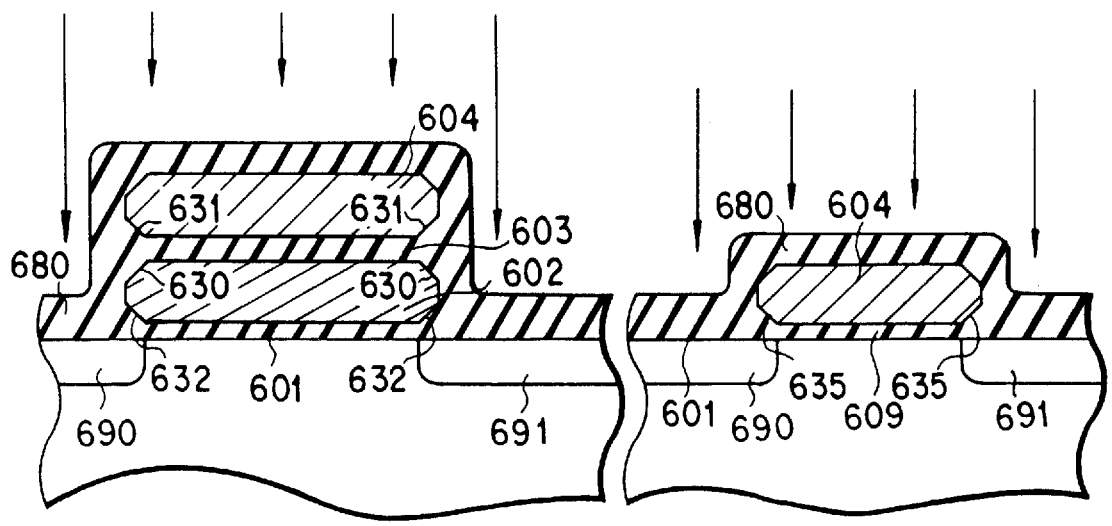
FIG. 6 is a diagram illustrating another step in the method of manufacturing a conventional non-volatile semiconductor memory device.

Preferred embodiments of the present invention will be described in detail hereinbelow with reference to the attached drawings.

FIG. 7 shows a plan view of a non-volatile semiconductor memory device according to a first embodiment of the present invention. A cross sectional view of the device of the first embodiment taken along line VIII—VIII of FIG. 7 is shown in FIG. 8, and a cross sectional view taken along line IX—IX of FIG. 7 is shown in FIG. 9.

As shown in FIG. 8, a first thin insulation film 101 is provided on a semiconductor substrate 100. A floating gate 102 illustratively made of conductive polysilicon layer is formed on the first insulation film 101. An impurity introduction portion 122 (containing nitrogen or the like) is formed in the upper surface of the polysilicon layer 102. As explained below, the impurity introduction portion 122 suppresses the reaction of the surface of the polysilicon layer with the oxidizer during the post oxidization procedure. A second thin insulation film 103 is provided on the impurity introduction portion 122, and a control gate 104 illustratively made of a conductive polysilicon layer is laminated on the second insulation film 103. Thus, the first insulation film layer functions as a first gate insulation film, and the second insulation film layer functions as an interpoly insulation film.

In the memory cell of FIG. 8, gate bird's beaks 132 are formed in the lower edge of the floating gate 102, and gate bird's beaks 131 are formed in the lower edge of the control gate 104. However, bird's beaks are not formed in the upper edge of the floating gate 102. Further, as shown in the cross section in FIG. 9, the impurity is also introduced to the exposed slit-side surfaces 107 of the polysilicon layer 102 (i.e., the side portions above the field oxide film 105) using a rotated ion implantation procedure. Thus, the impurity introduction portion 122 is also provided on the slit-side surfaces 107 of the polysilicon layer 102 (i.e., floating gate), and the oxidization of the slit-side surfaces 107 is also suppressed.

Figure 10:
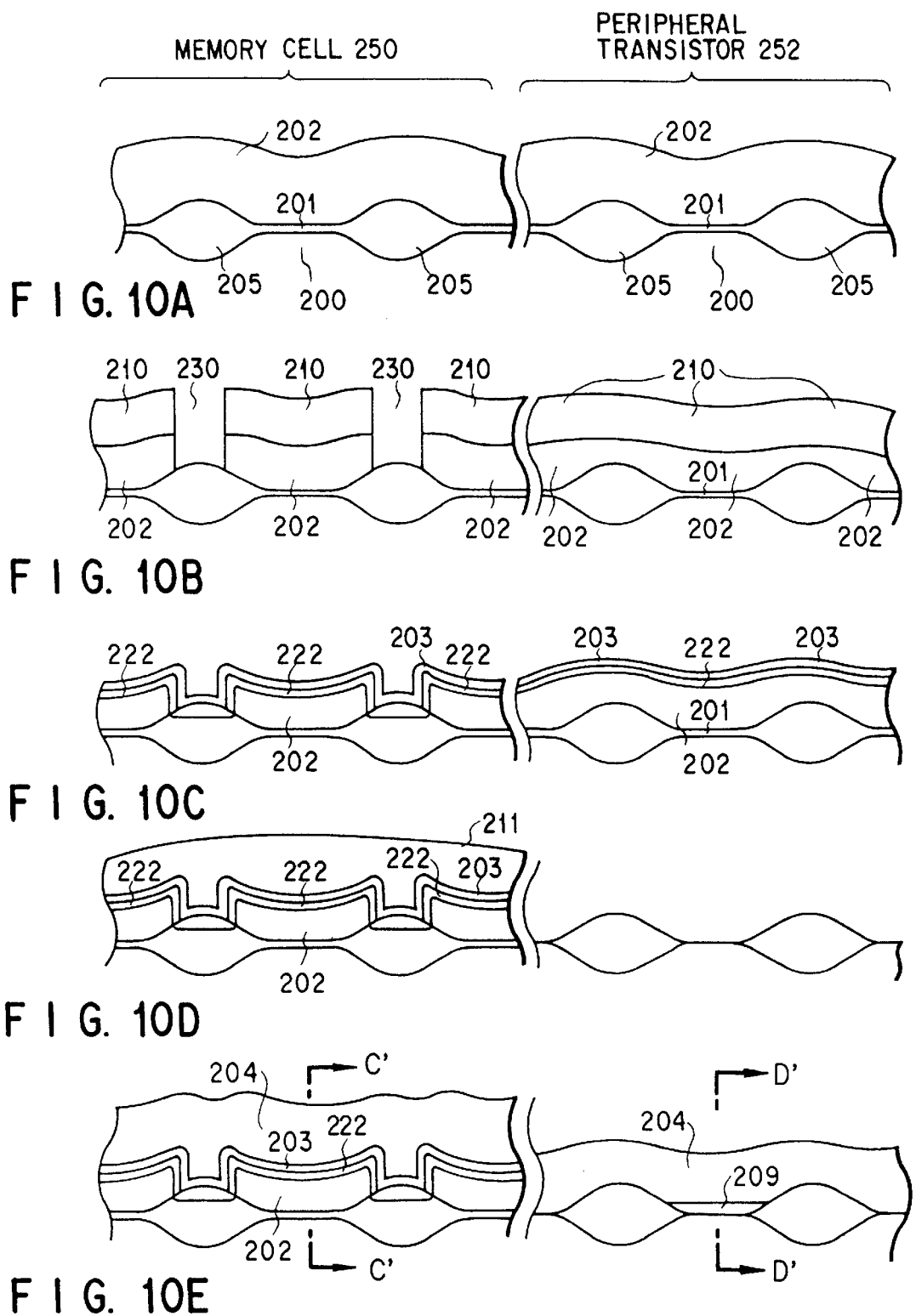
FIGS. 10A through 10E are diagrams illustrating a preferred method of manufacturing the non-volatile semiconductor memory device according to the first embodiment of present invention.

A preferred method of manufacturing the non-volatile semiconductor memory device according to the first embodiment will now be explained with reference to FIG. 10A through 10E. Each of these figures show, a typical memory cell section 250 from the core portion of the device and a typical peripheral transistor section 252 from the circuitry in the peripheral portion of the device. First, as shown in FIG. 10A, a field oxide film 205 is formed on the surface of a P-type substrate 200 in both the memory cell section 250 and the peripheral transistor section 252 using a known selective oxidization method. A thermal oxide (i.e., gate insulation) film 201 illustratively having a thickness of 10 nm is also formed on the surface of the substrate 200. Then, a polysilicon (Le., floating gate) layer 202 to which phosphorous was implanted at $5 \times 10^{19}$ to $4 \times 10^{20}$ cm$^{-3}$ is deposited to have an illustrative thickness of 200 nm in both the memory cell section 250 and the peripheral transistor section 252.

Then, as shown in FIG. 10B, a resist 210 is applied over the floating gate layer 202 in order to form an element separation region (or slit) in the memory cell section 250. Specifically, parallel grooves are formed in the resist 210, and then the resist is used as a mask to form grooves 230 in the floating gate layer 202 using RIE or the like. After removing the resist, an oxidization suppressing impurity such as nitrogen is implanted into the exposed surface portion of the floating gate layer 202 to form an impurity introduction portion 222 of the floating gate layer 202, as shown in FIG. 10C. The impurity implantation is carried out through ion implantation at an acceleration energy of 10 keV with an implantation amount of $1 \times 10^{19}$ to $5 \times 10^{20}$ cm$^{-3}$ to form an impurity introduction portion 222 having an illustrative thickness of 5 to 10 nm. An interpoly insulation film 203 having a thickness of 16 to 20 nm is then formed on the impurity introduction portion 222 in both the memory cell section 250 and the peripheral transistor section 252 using CVD or the like.

Next, a second resist 211 is applied over the entire surface of the memory cell section 250, as shown in FIG. IOD. Then, the interpoly insulation film 203, the floating gate layer 202 containing the oxidization suppressing impurity introduction portion 222, and the gate insulation film 201, are successively removed from the peripheral transistor section 252 using RIE and chemical dry etching ("CDE") or the like. As shown in FIG. 10E, after removing the resist 211, a second gate insulation film 209 is formed in the peripheral transistor section 252 using a heat oxidizing method. Then, a polysilicon layer 204 to which phosphorous was implanted at $5 \times 10^{19}$ to $4 \times 10^{20}$ cm$^{-3}$ is deposited to have an illustrative thickness of 350 nm in both the memory cell section 250 and the peripheral transistor section 252. The polysilicon layer 204 functions as a control gate in the memory cell section 250, and as a gate electrode in the peripheral transistor section 252.

Next, a third resist (not shown) is applied over the polysilicon layer 204, and parallel grooves perpendicular to the slit pattern are formed in the resist using a lithography method. Then, using the resist as a mask, the polysilicon layer 204 (Le., the control gate), the interpoly insulation film 203, and the polysilicon layer 202 containing the impurity introduction portion 222 (i.e., the floating gate) are successively etched in the memory cell section 250 using RIE or the like. Additionally, in the peripheral transistor section 252, the polysilicon layer 204 (Le., the gate electrode) is etched using the resist as a mask. Then, the resist is removed and the entire surface of the memory cell section 250 and the peripheral transistor section 252 is subjected to thermal oxidization (i.e., post oxidization) to form an insulation film 280 in both portions.

Figure 11:
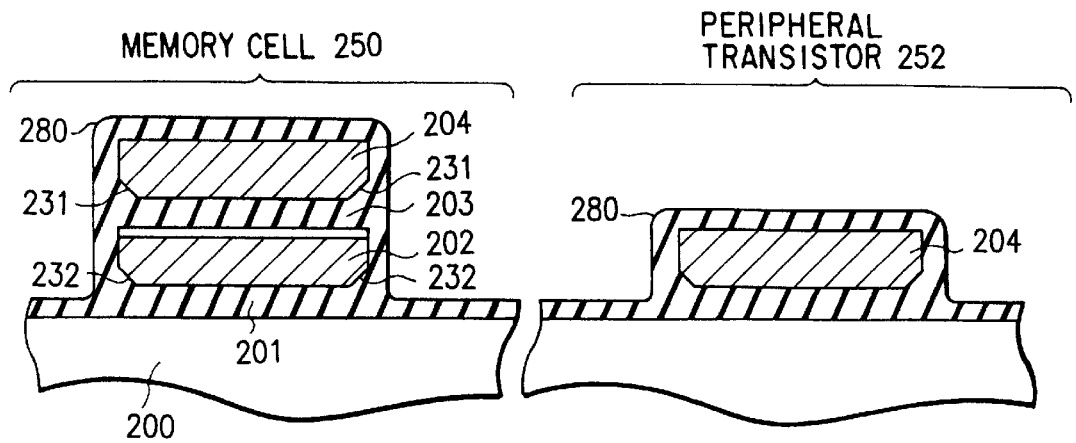
FIG. 11 is a diagram showing a cross sectional view of the memory cell section taken along line C'—C' of FIG. 10E and a cross sectional view of the peripheral transistor section taken along line D'—D' of FIG. 10E.
Figure 12:
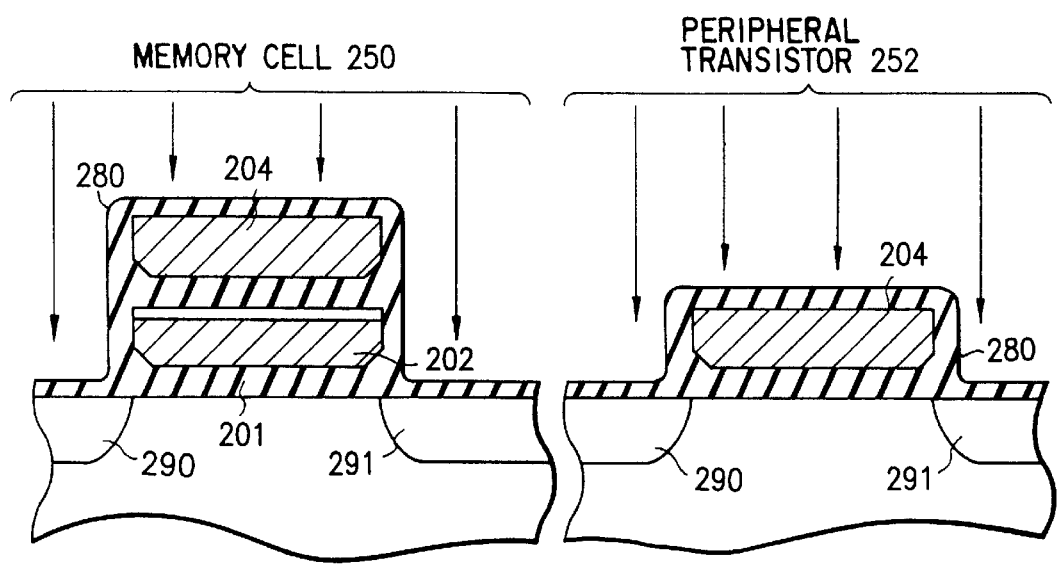
FIG. 12 is a diagram illustrating another step in the method of manufacturing the non-volatile semiconductor memory device according to the first embodiment.

FIG. 11 shows cross sectional views of the memory cell section 250 (taken along line C'—C' of FIG. 10E) and the peripheral transistor section 252 (taken along line D'—D' of FIG. 10E) after the gates have been etched and the post oxidization procedure has been completed. Next, as shown in FIG. 12, an impurity is implanted into the memory cell section 350 and the peripheral transistor section 352 by a known ion implantation method to form diffusion layers 290 and 291. In each section, the diffusion layers 290 and 291 function as the source/drain regions of the respective transistors. Although not shown in the figures, an interlayer insulation film and wiring are then formed to complete the non-volatile semiconductor memory device of the first embodiment of the present invention.

As explained above, in the first embodiment of the present invention, a substance that suppresses oxidization is introduced into an upper portion of the floating gate. This suppresses the reaction with the oxidizer during the post oxidization procedure, and thus prevents the formation of bird's beaks in the upper edge of the floating gate. Thus, in the non-volatile memory device of the first embodiment, the deterioration of the write/erase characteristics of the memory cells is reduced, and variations in the write/erase characteristics of the memory cells are lessened.

Figures 13, 14:
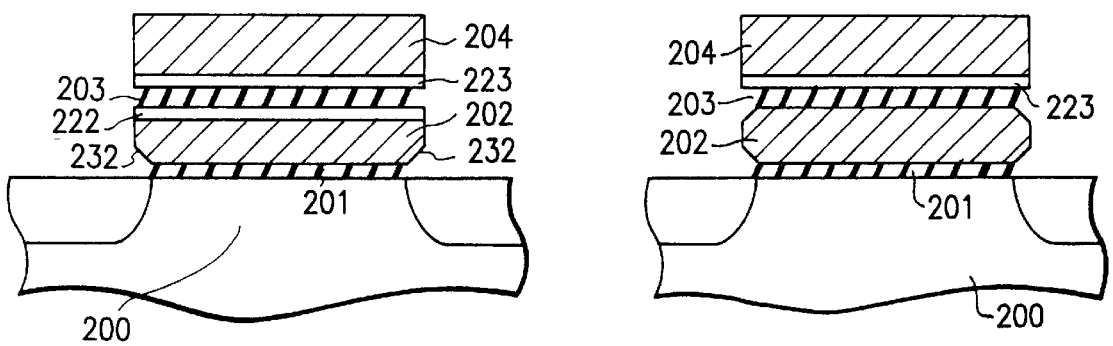
FIG. 13 is a cross sectional view of a second embodiment of the non-volatile semiconductor memory device according to the present invention.
FIG. 14 is a cross sectional view of a third embodiment of the non-volatile semiconductor memory device according to the present invention.

A second embodiment of the present invention is shown in FIG. 13. In the second embodiment, a second impurity introduction portion 223 (to which an oxidization suppressing impurity such as nitrogen has been introduced) is provided on the upper surface of the interpoly insulation film 203. The second impurity introduction portion 223 is provided in addition to the impurity introduction portion 222 provided in the upper surface of the floating gate 202. The two impurity introduction portions 222 and 223 suppress the reaction with the oxidizer during the post oxidization procedure, and thus prevent the formation of bird's beaks in the upper edge of the floating gate 202 and the lower edge of the control gate 203.

A method of manufacturing the memory cell of the second embodiment as shown in FIG. 13 will now be described. In addition to the steps explained above with respect to the first embodiment, after the interpoly insulation film 203 is formed (FIG. 10C), an oxidization suppressing impurity such as nitrogen is introduced into the surface portion of the interpoly insulation film 203 using CVD or the like. Through this additional step, a memory cell having the two impurity introduction portions 222 and 223 (FIG. 13) is realized.

A third embodiment of the present invention is shown in FIG. 14. In the third embodiment, only the "second" impurity introduction portion 223 is provided. In other words, the impurity introduction portion 222 provided in the upper portion of the floating gates of the first and second embodiments is omitted. In accordance with the present invention, only one of the impurity introduction portions 222 and 223 need be provided.

In the non-volatile semiconductor memory device of the present invention, the deterioration of the write/erase characteristics of the memory cells is reduced, and variations in the write/erase characteristics of the memory cells are lessened. This allows data to be written to or erased from the memory cells of the device at high speed.

In the embodiments described above, a single layer formed using CVD or the like is used as the interpoly insulation film 203. However, a multi-layer film could also be used to form the interpoly insulation film In such a case, the uppermost surface of the multi-layer structure is nitrided in accordance with the present invention. For example, in a further embodiment of the present invention, a triple-layer structure of oxide film/nitride film/oxide film ("ONO") is used between the floating gate and the control gate. In this embodiment, the uppermost surface of the ONO structure (i.e., the upper surface of the top oxide film) is nitrided in accordance with the present invention. Additionally, in the embodiments described above, nitrogen is illustratively used as the oxidization suppressing impurity. However, any substance that effectively suppresses the reaction with the oxidizer during the post oxidization procedure (e.g., germanium, gallium, or silicon) could be used.

Furthermore, the above-described embodiments form the impurity introduction portions by ion implanting the oxidization suppressing impurity into the surface of another layer (e.g., polysilicon layer 202). However, the oxidization suppressing impurity can also be introduced by other methods. According to one other method, after the removal of the resist 210, the impurity introduction portion 222 is formed by exposing the surface of the polysilicon layer 202 to an atmosphere containing the oxidization suppressing impurity. For example, the polysilicon layer can be exposed to an ammonium ($NH_3$) atmosphere at 800° to 1000° C. and 1.5 Torr for 30 to 60 minutes.

By using the exposure method to form the impurity introduction portion, the manufacturing cost for the device can be lowered. More specifically, if the ion implantation method is used, an ion implanting device must first be used to form the impurity introduction portion and then a chemical vapor depositing device must be used to form the interpoly insulation film 203. In contrast, if the exposure method is used, both the impurity introduction portion and the interpoly insulation film can be formed using the same chemical vapor depositing device. Additionally, when ions are implanted into the polysilicon layer 202 to form the impurity introduction portion, a physical defect such as surface damage to the floating gate may be caused by the ions. On the other hand, the exposure method will not cause such defects so a reliable memory device can be manufactured at a lower cost.

While there has been illustrated and described what are presently considered to be the preferred embodiments of the present invention, it will be understood by those in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method of manufacturing a non-volatile semiconductor memory device, said method comprising the steps of:

forming a gate insulation film on a semiconductor substrate;

depositing a conductive polysilicon layer;

introducing a first oxidization suppressing substance to an upper surface of the first conductive layer;

forming an interpoly insulation film on the upper surface of the first conductive layer;

forming a second conductive layer over an upper surface of the interpoly insulation film; and introducing a second oxidization suppressing substance to the upper surface of the interpoly insulation film.

2. The method as defined in claim 1, wherein nitrogen ions are implanted in both the step of introducing a first oxidization suppressing substance and the step of introducing a second oxidization suppressing substance.

3. The method as defined in claim 1, further comprising the steps of:

patterning the second conductive layer to form a control gate;

forming an insulation film at least over the control gate using thermal oxidization, the first and second oxidization suppressing substances acting to prevent the formation of bird's beaks in the upper surface of the first conductive layer and the lower surface of the control gate during the thermal oxidization.

4. A method of manufacturing a non-volatile semiconductor memory device, said method comprising the steps of:

forming a gate insulation film on a semiconductor substrate;

forming a first conductive layer over the gate insulation film;

introducing a first oxidization suppressing substance to an upper surface of the first conductive layer;

forming an interpoly insulation film on the upper surface of the polysilicon layer; and forming a second conductive layer over an upper surface of the interpoly insulation film, wherein nitrogen ions are implanted in the step of introducing a first oxidization suppressing substance.

5. The method as defined in claim 4, wherein the interpoly insulation film is a multi-layer film including a three-layer structure comprising a first oxide film, a nitride film, and a second oxide film ("ONO").

6. The method as defined in claim 4, further comprising the step of forming an insulation film at least over the second conductive layer using thermal oxidation, the first oxidization suppressing substance acting to prevent the formation of bird's beaks in the upper surface of the polysilicon layer during the thermal oxidation.

7. A method of manufacturing a non-volatile semiconductor memory device, said method comprising the steps of:

forming a gate insulation film on a semiconductor substrate;

forming a first conductive layer over the gate insulation film;

forming an interpoly insulation film on the first conductive layer;

introducing an oxidization suppressing substance to an upper surface of the interpoly insulation film; and forming a second conductive layer over the upper surface of the interpoly insulation film, wherein nitrogen ions are implanted in the step of introducing an oxidization suppressing substance.

8. The method as defined in claim 7, further comprising the step of forming an insulation film at least over the second conductive layer using thermal oxidation, the oxidization suppressing substance acting to prevent the formation of birds's beaks in the lower surface of the second conductive layer during the thermal oxidation.

9. A non-volatile semiconductor memory device comprising:

a semiconductor substrate having a first conductivity type;

diffusion regions having a second conductivity type opposite to the first conductivity type, the diffusion regions being formed in a surface of the semiconductor substrate at predetermined locations;

a gate insulation film formed on the semiconductor substrate;

a first conductive layer formed over the gate insulation film, the first conductive layer having an upper surface containing a first oxidization suppressing substance;

an interpoly insulation film formed on the upper surface of the first conductive layer, the interpoly insulation film having an upper surface containing a second oxidization suppressing substance; and a second conductive layer over the upper surface of the interpoly insulation film.

10. The non-volatile semiconductor memory device as defined in claim 9, wherein both the first and second oxidization suppressing substances are nitrogen.

11. The non-volatile semiconductor memory device as defined in claim 9, wherein the first and second oxidization suppressing substances are the same.

12. The non-volatile semiconductor memory device as defined in claim 9, wherein the first oxidization suppressing substance is nitrogen.

13. The non-volatile semiconductor memory device as defined in claim 9, wherein the second oxidization suppressing substance is nitrogen.

14. The non-volatile semiconductor memory device as defined in claim 9, wherein the interpoly insulation film is a multi-layer film.

15. The non-volatile semiconductor memory device as defined in claim 14, wherein the multi-layer film has a three layer structure comprising a first oxide film, a nitride film, and a second oxide film ("ONO").

16. A method of manufacturing a non-volatile semiconductor memory device, said method comprising the steps of:

forming a gate insulation film on a semiconductor substrate;

forming a first conductive layer over the gate insulation film;

introducing a first oxidization suppressing substrate to an upper surface of the first conductive layer;

forming an interpoly insulation film on the upper surface of the first conductive layer;

introducing a second oxidization suppressing substance to an upper surface of the interpoly insulation film; and forming a second conductive layer over the upper surface of the interpoly insulation film.

17. The method as defined in claim 16, wherein nitrogen ions are implanted in both the step of introducing a first oxidization suppressing substance and the step of introducing a second oxidization suppressing substance.

18. The method as defined in claim 16, further comprising the step of forming an insulation film at least over the control gate using thermal oxidation, the first and second oxidization suppressing substances acting to prevent the formation of bird's beaks in the upper surface of the polysilicon layer and the lower surface of the control gate during the thermal oxidation.

19. The method as defined in claim 16, wherein nitrogen ions are implanted in the step of introducing a first oxidization suppressing substance.

20. The method as defined in claim 16, wherein nitrogen ions are implanted in the step of introducing a second oxidization suppressing substance.

21. The method as defined in claim 16, wherein in the step of introducing a first oxidization suppressing substance, the upper surface of the polysilicon layer is exposed to an atmosphere containing the first oxidization suppressing substance.

22. The method as defined in claim 16, wherein the interpoly insulation film is a multi-layer film including a three layer structure comprising a first oxide film, a nitride film, and a second oxide film ("ONO").

* * * * *

UNITED STATES PATENT AND TRADEMARK OFFICE
CERTIFICATE OF CORRECTION

PATENT NO. : 5,847,427
DATED : December 8, 1998
INVENTOR(S) : Hiroyuki Hagiwara

It is certified that error appears in the above-identified patent and that said Letters Patent is hereby corrected as shown below:

On the title page, Col. 1, in the [54] under the title, the last word in the title "BREAKS" is incorrect. It should read

-- BEAKS --.

Signed and Sealed this

Eleventh Day of May, 1999

*Attest:*

Q. TODD DICKINSON

*Attesting Officer*   Acting Commissioner of Patents and Trademarks